US010564514B1

(12) United States Patent
Pan et al.

(10) Patent No.: US 10,564,514 B1
(45) Date of Patent: Feb. 18, 2020

(54) NONLINEAR OPTICAL CRYSTAL OF CESIUM FLUOROOXOBORATE, AND METHOD OF PREPARATION AND USE THEREOF

(71) Applicant: XinJiang Technical Institute of Physics & Chemistry, Chinese Academy of Sciences, Urumqi (CN)

(72) Inventors: Shilie Pan, Urumqi (CN); Xuefei Wang, Urumqi (CN); Fangfang Zhang, Urumqi (CN); Ying Wang, Urumqi (CN)

(73) Assignee: XINJIANG TECHNICAL INSTITUTE OF PHYSICS & CHEMISTRY, CHINESE ACADEMY OF SCIENCES, Urumqi (CN)

( * ) Notice: Subject to any disclaimer, the term of this patent is extended or adjusted under 35 U.S.C. 154(b) by 0 days.

(21) Appl. No.: 16/594,078

(22) Filed: Oct. 7, 2019

Related U.S. Application Data

(62) Division of application No. 16/306,902, filed on Dec. 4, 2018.

(51) Int. Cl.

| | |
|---|---|
| ***G02F 1/355*** | (2006.01) |
| ***C30B 11/00*** | (2006.01) |
| ***C30B 15/00*** | (2006.01) |
| ***C30B 29/10*** | (2006.01) |
| ***C30B 7/04*** | (2006.01) |

(Continued)

(52) U.S. Cl.
CPC .......... *G02F 1/3551* (2013.01); *C01B 35/121* (2013.01); *C30B 7/04* (2013.01); *C30B 7/10* (2013.01); *C30B 9/12* (2013.01); *C30B 11/00* (2013.01); *C30B 11/003* (2013.01); *C30B 15/00* (2013.01); *C30B 15/20* (2013.01); *C30B 17/00* (2013.01); *C30B 29/10* (2013.01); *G02F 1/353* (2013.01); *G02F 1/39* (2013.01);
(Continued)

(58) Field of Classification Search
CPC .............................. C30B 29/10; G02F 1/3551
See application file for complete search history.

(56) References Cited

U.S. PATENT DOCUMENTS 8,023,180 B2 * 9/2011 Chen ......................... C30B 9/12 117/3
8,287,715 B2 * 10/2012 Taylor ....................... C25B 1/00 205/410

(Continued)

OTHER PUBLICATIONS

Wang et al. "CsB406F: A Congruent-Melting Deep-Ultraviolet Nonlinear Optical Material by Combining Superior Functional Units", Angew. Chem. Int. Ed. 56 (Sep. 2017), pp. 14119-14123.*

*Primary Examiner* — Daniel Petkovsek
(74) *Attorney, Agent, or Firm* — Gokalp Bayramoglu

(57) ABSTRACT

A nonlinear optical crystal of cesium fluorooxoborate, and a method of preparation and use thereof. The crystal has a chemical formula of $CsB_4O_6F$ and a molecular weight of 291.15. It belongs to an orthorhombic crystal system, with a space group of $Pna2_1$, crystal cell parameters of a=7.9241 Å, b=11.3996 Å, c=6.6638 Å, and α=β=γ=90°, and a unit cell volume of 601.95 $Å^3$. A melt method, high temperature solution method, vacuum encapsulation method, hydrothermal method or room temperature solution method is used to grow the crystal of $CsB_4O_6F$.

5 Claims, 2 Drawing Sheets

(51) Int. Cl.

| | |
|---|---|
| ***C30B 7/10*** | (2006.01) |
| ***C30B 17/00*** | (2006.01) |
| ***C01B 35/12*** | (2006.01) |
| ***G02F 1/35*** | (2006.01) |
| ***G02F 1/39*** | (2006.01) |
| ***C30B 15/20*** | (2006.01) |
| ***C30B 9/12*** | (2006.01) |
| *G02F 1/37* | (2006.01) |

(52) U.S. Cl.

CPC ............ *C01P 2002/72* (2013.01); *G02F 1/37* (2013.01); *G02F 2001/354* (2013.01)

(56) References Cited

U.S. PATENT DOCUMENTS

| | | | | |
|---|---|---|---|---|
| 8,730,563 | B2 * | 5/2014 | Pan | C30B 9/06 359/326 |
| 9,740,081 | B1 * | 8/2017 | Kaminski | G02F 1/3544 |
| 2006/0054864 | A1 * | 3/2006 | Alekel | C09K 11/7712 252/301.4 R |
| 2018/0120671 | A1 * | 5/2018 | Halasyamani | H01S 5/0092 |

* cited by examiner

NONLINEAR OPTICAL CRYSTAL OF CESIUM FLUOROOXOBORATE, AND METHOD OF PREPARATION AND USE THEREOF

CROSS REFERENCE TO RELATED APPLICATIONS

This application is a division of U.S. patent application Ser. No. 16/306,902 filed on Dec. 4, 2018.

TECHNICAL FIELD

The present invention relates to a nonlinear optical crystal of $CsB_4O_6F$, and a method of preparation and use thereof.

BACKGROUND

As a kind of important components of all-solid-state lasers, nonlinear optical crystals have always been widely concerned both at home and abroad. After half a century's researches, a series of nonlinear optical crystals with excellent properties have been found. Typical nonlinear optical crystals used in the visible light region include $KTiOPO_4$ (KTP), $KH_2PO_4$ (KDP), etc. Nonlinear optical crystals used in the ultraviolet region that have been industrialized include $LiB_3O_5$ (LBO), $CsB_3O_5$ (CBO), $CsLiB_6O_{10}$ (CLBO), $BaB_2O_4$ (BBO), etc. However, $KBe_2BO_3F_2$ (KBBF) is the only available crystal that can apply in the deep-ultraviolet region below 200 nm. The application of KBBF is restricted due to its long growth period highly toxic element Be and layer growth habit, etc. Therefore, it is necessary to explore new deep-ultraviolet nonlinear optical crystals with better performances.

The inventors developed a compound of ammonium fluorooxoborate, $NH_4B_4O_6F$, and a nonlinear optical crystal of $NH_4B_4O_6F$ in previous studies, as described in the patent application No. 201611128283.3. The main differences between the present invention and $NH_4B_4O_6F$ is that the $NH_4^+$ is linked to the anion group by a hydrogen bond in $NH_4B_4O_6F$, while the $Cs^+$ is linked to the anion group by an ionic bond in $CsB_4O_6F$, resulting in completely different structures and growth habits, as well as different key parameters of the growth process, crystal properties, and the like between $CsB_4O_6F$ and $NH_4B_4O_6F$.

SUMMARY

An object of the present invention is to provide a compound of cesium fluorooxoborate, which has a chemical formula of $CsB_4O_6F$ and a molecular weight of 291.15 and is prepared by solid-state reaction or vacuum encapsulation method.

Another object of the present invention is to provide a nonlinear optical crystal of cesium fluorooxoborate, which has a chemical formula of $CsB_4O_6F$ and a molecular weight of 291.15. The crystal belongs to an orthorhombic crystal system, with the space group of $Pna2_1$, unit cell parameters of a=7.9241 Å, b==11.3996 Å, c=6.6638 Å, and α=β=γ=90°, and a unit cell volume of 601.95 Å$^3$.

Yet another object of the present invention is to provide a method for preparing the nonlinear optical crystal of $CsB_4O_6F$, comprising growing the crystal by a melt method, high temperature solution method, vacuum encapsulation method, hydrothermal method or room temperature solution method.

Yet another object of the present invention is to provide the utilities of the nonlinear optical crystal of $CsB_4O_6F$.

The present invention provides a compound of cesium fluorooxoborate with the chemical formula of $CsB_4O_6F$ and the molecular weight of 291.15.

In the method for preparing the compound of cesium fluorooxoborate as described herein, the compound is prepared by a solid-state synthesis method or a vacuum encapsulation method.

The solid-state synthesis method for preparing the compound of cesium fluorooxoborate comprises the steps of:

mixing a Cs-containing compound, a B-containing compound and an F-containing compound homogeneously with the molar ratio of Cs:B:F=0.5-2:3-5:0.5-2; filling the mixture into a platinum crucible; then placing the platinum crucible in a muffle furnace, and increasing the temperature to 350-600° C. for 3-96 hours, to give the compound of $CsB_4O_6F$; wherein the Cs-containing compound is $Cs_2CO_3$, $CsNO_3$, $CsHCO_3$, CsF or $CsBF_4$; the F-containing compound is CsF or $CsBF_4$; and the B-containing compound is $H_3BO_3$, $B_2O_3$ or $CsBF_4$.

The vacuum encapsulation method for preparing the compound of cesium fluorooxoborate comprises the steps of:

mixing a Cs-containing compound, a B-containing compound and an F-containing compound homogeneously at a molar ratio of Cs:B:F=0.5-2:3-5:0.5-2; filling the mixture into a Φ40 mm quartz tube; vacuumizing the quartz tube to a vacuum degree of $1\times10^{-3}$ Pa, and sealing it with high temperature; then placing the quartz tube in a muffle furnace, and increasing the temperature to 350-600° C. at a rate of 10-50° C. for 3-96 hours, to give the compound of $CsB_4O_6F$; wherein the Cs-containing compound is $Cs_2CO_3$, $CsNO_3$, $CsHCO_3$, CsF or $CsBF_4$; the F-containing compound is CsF or $CsBF_4$; and the B-containing compound is $H_3BO_3$, $B_2O_3$ or $CsBF_4$.

Provided herein is a nonlinear optical crystal of cesium fluorooxoborate. The crystal has a chemical formula of $CsB_4O_6F$ with molecular weight of 291.15. The crystal belongs to an orthorhombic crystal system, with the space group of $Pna2_1$, unit cell parameters of a=7.9241 Å, b=11.3996 Å, c=6.6638 Å, and α=β=γ=90°, and a unit cell volume of 601.95 Å$^3$.

In the method of preparing the nonlinear optical crystal of cesium fluorooxoborate as described herein, the crystal is grown by a melt method, high temperature solution method, vacuum encapsulation method, hydrothermal method or room temperature solution method.

The melt method for growing the nonlinear optical crystal of cesium fluorooxoborate comprises the following steps:

a) mixing a Cs-containing compound, a B-containing compound and an F-containing compound homogeneously at a molar ratio of Cs:B:F=0.5-2:3-5:0.5-2; filling the mixture into a platinum crucible; then placing the platinum crucible in a muffle furnace, and increasing the temperature to 350-600° C. for 3-96 hours, to give a polycrystal powder of the compound of $CsB_4O_6F$; wherein the Cs-containing compound is $Cs_2CO_3$, $CsNO_3$, $CsHCO_3$, CsF or $CsBF_4$; the F-containing compound is CsF or $CsBF_4$; and the B-containing compound is $H_3BO_3$, $B_2O_3$ or $CsBF_4$;

b) filling the resultant polycrystal powder of the compound of $CsB_4O_6F$ into a clean platinum crucible; placing the platinum crucible in a muffle furnace, and increasing the temperature to 400-700° C. at a rate of 20-40° C./i for 7-15 hours, to give a melt; wherein the Cs-containing compound is $Cs_2CO_3$, $CsNO_3$, $CsHCO_3$, CsF or $CsBF_4$; the F-containing compound is CsF or $CsBF_4$; and the B-containing compound is $H_3BO_3$, $B_2O_3$ or $CsBF_4$;

c) decreasing the temperature of the melt from step b) to 400-590° C. at a rate of 0.1-5° C./h, to 300-440° C. at a rate of 0.2-2° C./h, and further to 30° C. at a rate of 3-15° C./h, to give a seed crystal of $CsB_4O_6F$; and d) growing the crystal in the melt of the compound by the Czochralski method, comprising fixing the seed crystal obtained from step c) onto a seed crystal rod; lowering the seed crystal to 1 mm above the liquid surface from the top of a crystal growing furnace for the melt prepared in step b), and preheating it for 5-60 minutes; then immersing the seed crystal in the liquid at 1-5 mm below the surface; rotating the crystal at 2-30 rpm by a crystal growth controller and controlling the temperature to saturate the melt; lifting the seed crystal at a rate of 1-3 mm/day while keeping the temperature constant; upon completion of the crystal growth, pulling the crystal on the seed crystal rod, and decreasing the temperature to 300-440° C. at a rate of 0.2-2° C./h, and further to 30° C. at a rate of 3-15° C./h, to obtain the nonlinear optical crystal of $CsB_4O_6F$;

alternatively, growing the crystal in the melt of the compound by the Kyropoulos method, comprising fixing the seed crystal obtained from step c) onto a seed crystal rod; lowering the seed crystal to 1 mm above the liquid surface from the top of a crystal growing furnace for the melt prepared in step b), and preheating it for 5-60 minutes; then immersing the seed crystal in the liquid at 1-5 mm below the surface; decreasing the temperature at a rate of 0.1-0.7° C./h; 3-10 hours later, lifting the seed crystal by 1-2 mm, and further decreasing the temperature at a rate of 0.1-0.7° C./h; upon completion of the crystal growth, pulling the crystal on the seed crystal rod, and decreasing the temperature to 300-440° C. at a rate of 0.2-2° C./h, and further to 30° C. at a rate of 3-15° C./h, to obtain the nonlinear optical crystal of $CsB_4O_6F$;

alternatively, growing the crystal in the melt of the compound by the Bridgeman-Stockbarger method, comprising placing the seed crystal prepared in step c) at the bottom of a crucible, then adding the polycrystal compound of $CsB_4O_6F$ prepared in step a) to the crucible; sealing the platinum crucible, and increasing the temperature of the growing furnace to 500-700° C. for 7-15 hours; adjusting the position of the crucible such that the seeding temperature is 500-625° C.; then lowering the crucible at a rate of 1-10 mm/day while keeping the growth temperature constant; upon completion of the growth, decreasing the temperature to 300-440° C. at a rate of 0.2-2° C./h, and further to 30° C. at a rate of 3-15° C./h; and removing the platinum crucible, to obtain the nonlinear optical crystal of $CsB_4O_6F$.

The high temperature solution method for growing the nonlinear optical crystal of cesium fluorooxoborate comprises the following steps:

a) mixing a Cs-containing compound, a B-containing compound and an F-containing compound homogeneously at a molar ratio of Cs:B:F=0.5-2:3-5:0.5-2; filling the mixture into a platinum crucible; then placing the platinum crucible in a muffle furnace, and increasing the temperature to 350-600° C. for 3-96 hours, to give a polycrystal powder of the compound of $CsB_4O_6F$; wherein the Cs-containing compound is $Cs_2CO_3$, $CsNO_3$, $CsHCO_3$, CsF or $CsBF_4$; the F-containing compound is CsF or $CsBF_4$; and the B-containing compound is $H_3BO_3$, $B_2O_3$ or $CsBF_4$;

b) mixing the polycrystal powder of the compound of $CsB_4O_6F$ obtained from step a) homogeneously with a fluxing agent at a molar ratio of 1:0.1-0.5; then filling the mixture into a clean platinum crucible, and increasing the temperature to 400-700° C. at a rate of 35-45° C./h for 7-15 hours, to give a meltsolution; wherein the Cs-containing compound is $Cs_2CO_3$, $CsNO_3$, $CsHCO_3$, CsF or $CsBF_4$; the F-containing compound is CsF or $CsBF_4$; the B-containing compound is $H_3BO_3$, $B_2O_3$ or $CsBF_4$; and the fluxing agent is CsF, $H_3BO_3$, $B_2O_3$, PbO or $PbF_2$;

c) preparation of a seed crystal: placing the melt solution prepared in step b) into a single crystal furnace, and then decreasing the temperature to 350-610° C. at a rate of 0.1-5° C./h, to 300-385° C. at a rate of 0.2-0.6° C./h, and further to 30° C. at a rate of 3-10° C./h, to give a seed crystal of $CsB_4O_6F$; and d) growth of a crystal: fixing the resultant seed crystal of $CsB_4O_6F$ onto a seed crystal rod; lowering the seed crystal to 1 mm above the liquid surface from the top of a crystal growing furnace for the meltsolution prepared in step b), and preheating it for 10-25 minutes; contacting the seed crystal with the liquid surface, and decreasing the temperature at a rate of 0.1-2° C./h; upon completion of the crystal growth, pulling the crystal away from the surface of the solution, and then decreasing the temperature to 30° C. at a rate of 3-10° C./h, to obtain the nonlinear optical crystal of $CsB_4O_6F$.

The vacuum encapsulation method for growing the nonlinear optical crystal of cesium fluorooxoborate comprises the following steps:

a) mixing a Cs-containing compound, a B-containing compound and an F-containing compound homogeneously at a molar ratio of Cs:B:F=0.5-2:3-5:0.5-2; filling the mixture into a platinum crucible; then placing the platinum crucible in a muffle furnace, and increasing the temperature to 350-600° C. at a rate of 10-50° C. for 3-96 hours, to give a polycrystal powder of the compound of $CsB_4O_6F$; wherein the Cs-containing compound is $Cs_2CO_3$, $CsNO_3$, $CsHCO_3$, CsF or $CsBF_4$; the F-containing compound is CsF or $CsBF_4$; and the B-containing compound is $H_3BO_3$, $B_2O_3$ or $CsBF_4$; and b) mixing the polycrystal powder of the compound of $CsB_4O_6F$ obtained from step a) homogeneously with a fluxing agent at a molar ratio of 1:0.1-1; then filling the mixture into a quartz tube, and increasing the temperature to 400-700° C. at a rate of 10-50° C./h for 3-96 hours; then decreasing the temperature to 330-450° C. at a rate of 0.5-1.5° C./day, and further to 30° C. at a rate of 2-5° C./h; and cutting the quartz tube to obtain the nonlinear optical crystal of $CsB_{46}F$; wherein the Cs-containing compound is $Cs_2CO_3$, $CsNO_3$, $CsHCO_3$, CsF or $CsBF_4$; the F-containing compound is CsF, $CsBF_4$ or HF; the B-containing compound is $H_3BO_3$, $B_2O_3$ or $CsBF_4$; and the fluxing agent is CsF, $H_3BO_3$, $B_2O_3$, PbO or $PbF_2$.

The hydrothermal method for growing the nonlinear optical crystal of cesium fluorooxoborate comprises the following steps:

a) mixing a Cs-containing compound, a B-containing compound and an F-containing compound homogeneously at a molar ratio of Cs:B:F=0.5-2:3-5:0.5-2; filling the mixture into a platinum crucible; then placing the platinum crucible in a muffle furnace, and increasing the temperature to 350-600° C. for 3-96 hours, to give a polycrystal powder product of $CsB_4O_6F$; wherein the Cs-containing compound is $Cs_2CO_3$, $CsNO_3$, $CsHCO_3$, CsF or $CH_3COOCs$; the F-containing compound is CsF or HF; and the B-containing compound is $H_3BO_3$ or $B_2O_3$;

b) dissolving the polycrystal powder of the compound of $CsB_4O_6F$ obtained from step a) in 5-30 mL of deionized water, and sonicating the incompletely dissolved mixture at a temperature of 20-50° C. for 5-30 minutes to allow for sufficient mixing and dissolution;

c) transferring the mixed solution obtained from step b) into the lining of a clean, pollution-free high pressure reactor with a volume of 100 mL, and tightening and sealing the reactor; and d) placing the high pressure reactor in a thermostat, increasing the temperature to 150-350° C. at a rate of 5-50° C./h for 3-15 days, and then decreasing the temperature to room temperature at a rate of 5-30° C./day, to obtain the nonlinear optical crystal of $CsB_4O_6F$.

The room temperature solution method for growing the nonlinear optical crystal of cesium fluorooxoborate comprises the following steps:

a) mixing a Cs-containing compound, a B-containing compound and an F-containing compound homogeneously at a molar ratio of (Cs:B:F=0.5-2:3-5:0.5-2; filling the mixture into a platinum crucible; then placing the platinum crucible in a muffle furnace, and increasing the temperature to 350-600° C. for 3-96 hours, to give a polycrystal powder product of $CsB_4O_6F$; wherein the Cs-containing compound is $Cs_2CO_3$, $CsNO_3$, $CsHCO_3$, CsF or $CH_3COOCs$; the F-containing compound is CsF or HF; and the B-containing compound is $H_3BO_3$ or $B_2O_3$;

b) placing the polycrystal powder of the compound of $CsB_4O_6F$ obtained from step a) in a clean glass container, to which 20-100 mL of deionized water is added, followed by ultrasonication for 5-60 minutes to allow for sufficient mixing and dissolution, and then adjusting the pH of the solution to 8-11 by addition of HF or CsOH;

c) sealing the container containing the solution in step b) with weighing paper, and placing it in a static environment without shaking, pollution and air convection; controlling the evaporation rate at 0.2-2 mL/day by piercing the seal; and setting it aside for 5-20 days at room temperature;

d) obtaining a seed crystal upon completion of the growth when the size of the crystal particles grown at the bottom of the container from the solution in step c) is no longer changed significantly; and e) filtering the remaining solution through qualitative filter paper to filter out grains and other impurities from the solution; selecting the seed crystal of better quality, fixing it with a platinum wire and suspending it in the filtered solution; controlling the evaporation rate at 0.2-2 mL/day by piercing the seal, and setting it aside for growth for 5-20 days at room temperature, to obtain the nonlinear optical crystal of $CsB_4O_6F$.

The present invention provides the utilities of the nonlinear optical crystal of cesium fluorooxoborate in the manufacture of an Nd:YAG laser that outputs a fundamental frequency light of 1064 nm for the second, third, fourth, fifth or sixth harmonic generation laser output.

The present invention provides the utilities of the nonlinear optical crystal of cesium fluorooxoborate in the production of a deep-ultraviolet frequency-multiplied light output of below 200 nm.

The present invention provides the utilities of the nonlinear optical crystal of the compound of cesium fluorooxoborate in the manufacture of a frequency multiplication generator, a frequency up or down converter or an optical parametric oscillator.

In the method of preparing the nonlinear optical crystal of cesium fluorooxoborate according to the present invention, the polycrystal powder of cesium fluorooxoborate for use in the preparation of the melt or mixed solution can also be replaced by raw materials which are directly weighed; that is, the Cs-containing compound, B-containing compound and F-containing compound can be weighed and mixed homogeneously at a molar ratio of Cs:B:F=0.5-2:3-5:0.5-2; wherein the Cs-containing compound is $Cs_2CO_3$, $CsNO_3$, $CsHCO_3$, CsF or $CsBF_4$; the F-containing compound is CsF or $CsBF_4$; and the B-containing compound is $H_3BO_3$, $B_2O_3$ or $CsBF_4$.

In the method for preparing the nonlinear optical crystal of cesium fluorooxoborate according to the present invention, the container used during the preparation is a platinum crucible, iridium crucible, ceramic crucible, quartz tube, conical flask, beaker, or hydrothermal reactor lined with polytetrafluoroethylene or lined with stainless steel with a platinum sleeve. When the container is a quartz tube, vacuumization is required before sealing to avoid burst of the quartz tube resulting from volatilization of the raw materials in the reaction. When the container is a conical flask or beaker, it needs to be washed with an acid, rinsed with deionized water, and air-dried.

In the method of preparing the nonlinear optical crystal of cesium fluorooxoborate according to the present invention, the resistance furnace used during the preparation is a muffle furnace or drying cabinet.

With the method for preparing the nonlinear optical crystal of cesium fluorooxoborate according to the present invention, a centimeter-sized nonlinear optical crystal of $CsB_4O_6F$ can be obtained. When a large-sized crucible or container is used and the growth cycle of the crystal is prolonged, a corresponding large-sized nonlinear optical crystal of $CsB_4O_6F$ can be obtained. During the growth of the nonlinear optical crystal of $CsB_4O_6F$, the crystal is easy to grow up without inclusions and has high transparency, and has the advantages of high growth rate, low cost, easy to obtain large-sized crystals, and so on.

The large-sized nonlinear optical crystal of $CsB_4O_6F$ obtained by the method for preparing the nonlinear optical crystal of cesium fluorooxoborate according to the present invention can be used as a nonlinear optical device by orienting the raw crystal based on the crystallographic data of the crystal, cutting the crystal according to the desired angle, thickness and sectional size, and polishing the transmission surface of the crystal. The nonlinear optical crystal of $CsB_4O_6F$ has the advantages of a wide transparent region, stable physical and chemical properties, a high mechanical hardness, being hard to break and deliquesce, being easy to cut, polish and preserve, and so on.

DETAILED DESCRIPTION OF THE EMBODIMENTS

Figure 1:
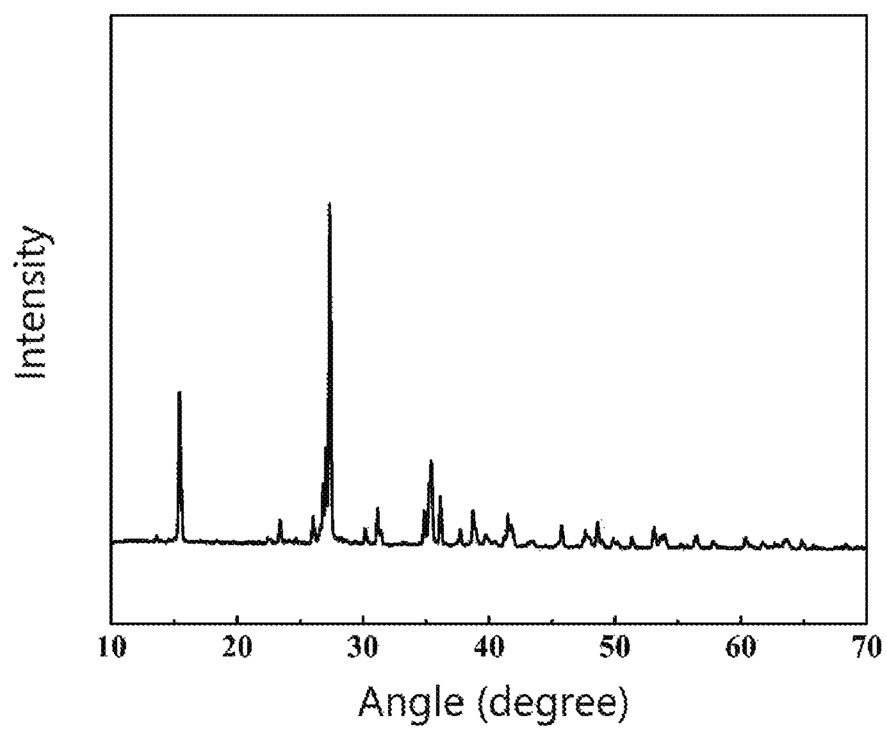
FIG. 1 shows a powder XRD pattern of the compound of $CsB_4O_6F$ of the present invention, which is consistent with the theoretical XRD pattern, demonstrating the presence of the compound of $CsB_4O_6F$.
Figure 2:
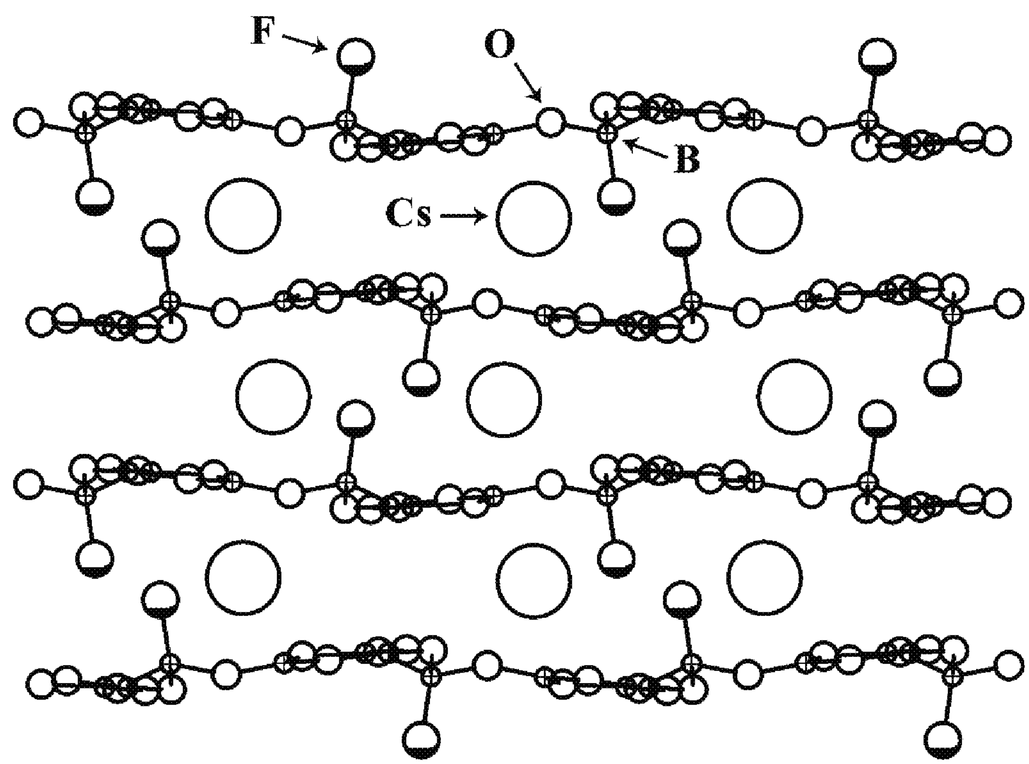
FIG. 2 shows the structure of the $CsB_4O_6F$ crystal of the present invention.

The present invention is further described with reference to the following Examples. It should be understood that the present invention is not limited to the Examples illustrated below, and any improvement made on the basis of the invention is not contrary to the spirit of the present invention. The raw materials and equipments used herein are all commercially available unless otherwise indicated.

Example 1: Preparation of a Compound

The compound of $CsB_4O_6F$ was synthesized by the solid-state synthesis method based on the reaction equation $CsF+2B_2O_3 \rightarrow CsB_4O_6F$.

CsF and $B_2O_3$ were mixed homogeneously at a molar ratio of 1:3. CsF and $H_3BO_3$ were mixed homogeneously at a molar ratio of 2:5. The mixtures were filled into a clean, pollution-free platinum crucible with a volume of 28 mL. The temperature was then increased to 350° C. for 96 hours, to obtain the compound of $CsB_4O_6F$.

Example 2: Preparation of a Compound

The compound of $CsB_4O_6F$ was synthesized by the solid-state reaction method based on the reaction equation $CsF+4H_3BO_3 \rightarrow CsB_4O_6F+6H_2O\uparrow$.

CsF and $H_3BO_3$ were mixed homogeneously at a molar ratio of 2:5, and filled into a clean, pollution-free platinum crucible with a volume of 28 mL. The temperature was then increased to 600° C. for 3 hours, to obtain the compound of $CsB_4O_6F$.

Example 3: Preparation of a Compound

The compound of $CsB_4O_6F$ was synthesized by the solid-state reaction method based on the reaction equation $12CsHCO_3+4CsBF_4 \rightarrow CsB_4O_6F+15CsF+6H_2O\uparrow+12CO_2\uparrow$.

$CsHCO_3$ and $CsBF_4$ were mixed homogeneously at a molar ratio of 2:3, and filled into a platinum crucible. The platinum crucible was placed in a muffle furnace, and the temperature was then increased to 450° C. for 56 hours, to obtain the compound of $CsB_4O_6F$.

Example 4: Preparation of a Compound

The compound of $CsB_4O_6F$ was synthesized by the solid-state reaction method based on the reaction equation $6Cs_2CO_3+4CsBF_4 \rightarrow CsB_4O_6F+15CsF+6CO_2\uparrow$.

$Cs_2CO_3$ and $CsBF_4$ were mixed homogeneously at a molar ratio of 2:3, and filled into a platinum crucible. The platinum crucible was placed in a muffle furnace, and the temperature was then increased to 460° C. for 96 hours, to obtain the compound of $CsB_4O_6F$.

Example 5: Preparation of a Compound

The compound of $CsB_4O_6F$ was synthesized by the solid-state synthesis method based on the reaction equation $12CsNO_3+4CsBF_4 \rightarrow CsB_4O_6F+15CsF+6N_2O_5$.

$CsNO_3$ and $CsBF_4$ were mixed homogeneously at a molar ratio of 2:3, and filled into a platinum crucible. The platinum crucible was placed in a muffle furnace, and the temperature was then increased to 470° C. for 96 hours, to obtain the compound of $CsB_4O_6F$.

Example 6: Preparation of a Compound

The compound of $CsB_4O_6F$ was synthesized by the vacuum encapsulation method based on the reaction equation $CsF+2B_2O_3 \rightarrow CsB_4O_6F$.

CsF and $B_2O_3$ were mixed homogeneously at a molar ratio of 1:3, and filled into a Φ40 mm quartz tube. The quartz tube was vacuumized to a vacuum degree of $1\times10^{-3}$ Pa, and vacuum encapsulated with a flame gun. The quartz tube was placed in a muffle furnace, and the temperature was then increased to 350° C. at a rate of 50° C. for 96 hours. The quartz tube was opened after the temperature was decreased to room temperature, to obtain the compound of $CsB_4O_6F$.

Example 7: Preparation of a Compound

The compound of $CsB_4O_6F$ was synthesized by the vacuum encapsulation method based on the reaction equation $CsF+4H_3BO_3 \rightarrow CsB_4O_6F+6H_2O\uparrow$.

CsF and $B_2O_3$ were mixed homogeneously at a molar ratio of 2:5, and filled into a Φ40 mm quartz tube. The quartz tube was vacuumized to a vacuum degree of $1\times10^{-3}$ Pa, and vacuum encapsulated with a flame gun. The quartz tube was placed in a muffle furnace, and the temperature was then increased to 600° C. at a rate of 10° C. for 96 hours. The quartz tube was opened after the temperature was decreased to room temperature, to obtain the compound of $CsB_4O_6F$.

Example 8: Preparation of a Compound

The compound of $CsB_4O_6F$ was synthesized by the vacuum encapsulation method based on the reaction equation $12CsHCO_3+4CsBF_4 \rightarrow CsB_4O_6F+15CsF+6H_2O\uparrow+12CO_2\uparrow$.

$CsHCO_3$ and $CsBF_4$ were mixed homogeneously at a molar ratio of 2:3, and filled into a Φ40 mm quartz tube. The quartz tube was vacuumized to a vacuum degree of $1\times10^{-3}$ Pa, and sealed at an elevated temperature. Then, the quartz tube was placed in a muffle furnace, and the temperature was increased to 470° C. at a rate of 6° C./h for 72 hours, to obtain the compound of $CsB_4O_6F$.

Example 9: Preparation of a Compound

The compound of $CsB_4O_6F$ was synthesized by the vacuum encapsulation method based on the reaction equation $6Cs_2CO_3+4CsBF_4 \rightarrow CsB_4O_6F+15CsF+6CO_2\uparrow$.

$Cs_2CO_3$ and $CsBF_4$ were mixed homogeneously at a molar ratio of 2:3, and filled into a Φ40 mm quartz tube. The quartz tube was vacuumized to a vacuum degree of $1\times10^{-3}$ Pa, and sealed at an elevated temperature. Then, the quartz tube was placed in a muffle furnace, and the temperature was increased to 460° C. at a rate of 5° C./h for 72 hours, to obtain the compound of $CsB_4O_6F$.

Example 10: Preparation of a Compound

The compound of $CsB_4O_6F$ was synthesized by the vacuum encapsulation method based on the reaction equation $12CsNO_3+4CsBF_4 \rightarrow CsB_4O_6F+15CsF+6N_2O_5$.

$CsNO_3$ and $CsBF_4$ were mixed homogeneously at a molar ratio of 2:3, and filled into a Φ40 mm quartz tube. The quartz tube was vacuumized to a vacuum degree of $1\times10^{-3}$ Pa, and sealed at an elevated temperature. Then, the quartz tube was placed in a muffle furnace, and the temperature was increased to 450° C. at a rate of 4° C./h for 72 hours, to obtain the compound of $CsB_4O_6F$.

Example 11: Synthesis of a Nonlinear Optical Crystal of $CsB_4O_6F$ by the High Temperature Solution Method The compound of $CsB_4O_6F$ obtained in accordance with Example 1 was mixed homogeneously with CsF as a fluxing agent at a molar ratio of 1:0.1, and filled into a clean platinum crucible. The platinum crucible was placed in a single crystal growing furnace, and the temperature was then increased to 400° C. at a rate of 35° C./h for 7 hours, to give a mixed solution.

Preparation of a seed crystal: the mixed solution as prepared was placed in a single crystal furnace, and the temperature was decreased to 350° C. at a rate of 0.1° C./h, to 300° C. at a rate of 0.2° C./h, and further to 30° C. at a rate of 3° C./h, to give a seed crystal of $CsB_4O_6F$.

Growth of a crystal: the seed crystal of $CsB_4O_6F$ obtained above was fixed on a seed crystal rod. The seed crystal was lowered to 1 mm above the liquid surface from the top of a crystal growing furnace containing the mixed solution as prepared, and preheated for 10 minutes. Then, the seed crystal was contacted with the liquid surface, and the temperature was decreased at a rate of 0.1° C./h. Upon completion of the crystal growth, the crystal on the seed crystal rod was pulled out, and the temperature was decreased to 30° C. at a rate of 3° C./h, to obtain a nonlinear optical crystal of $CsB_4O_6F$ with a size of 12 mm×13 mm×16 mm.

Example 12: Synthesis of a Nonlinear Optical Crystal of $CsB_4O_6F$ by the High Temperature Solution Method The compound of $CsB_4O_6F$ obtained in accordance with Example 2 was mixed with $PbF_2$ as a fluxing agent at a molar ratio of 1:0.5. The mixture was placed in a single crystal growing furnace, and the temperature was then increased to 700° C. at a rate of 45° C./h for 15 hours, to give a mixed solution.

Preparation of a seed crystal: the solution as prepared was placed in a single crystal furnace, and the temperature was decreased to 610° C. at a rate of 5° C./h, to 385° C. at a rate of 0.6° C./h, and further to 30° C. at a rate of 10° C./h, to give a seed crystal of $CsB_4O_6F$.

Growth of a crystal: the seed crystal of $CsB_4O_6F$ obtained above was fixed on a seed crystal rod. The seed crystal was lowered to 1 mm above the liquid surface from the top of a crystal growing furnace containing the mixed solution as prepared, and preheated for 25 minutes. Then, the seed crystal was contacted with the liquid surface, and the temperature was decreased at a rate of 2° C./h. Upon completion of the crystal growth, the crystal on the seed crystal rod was pulled out, and the temperature was decreased to 30° C. at a rate of 10° C./h, to obtain a nonlinear optical crystal of $CsB_4O_6F$ with a size of 15 mm×17 mm×18 mm.

Example 13: Synthesis of a Nonlinear Optical Crystal of $CsB_4O_6F$ by the High Temperature Solution Method The compound of $CsB_4O_6F$ obtained in accordance with Example 3 was mixed with $B_2O_3$ as a fluxing agent at a molar ratio of 1:0.5, and filled into a clean platinum crucible. The platinum crucible was placed in a single crystal growing furnace, and the temperature was increased to 690° C. at a rate of 40° C./h for 10 hours, to give a mixed solution.

Preparation of a seed crystal: the mixed solution as prepared was placed in the single crystal furnace, and the temperature was decreased to 580° C. at a rate of 3° C./h, to 330° C. at a rate of 0.6° C./h, and further to 30° C. at a rate of 8° C./h, to give a seed crystal of $CsB_4O_6F$.

Growth of a crystal: the seed crystal of $CsB_4O_6F$ obtained above was fixed on a seed crystal rod. The seed crystal was lowered to 1 mm above the liquid surface from the top of a crystal growing furnace containing the mixed solution as prepared, and preheated for 20 minutes. Then, the seed crystal was contacted with the liquid surface, and the temperature was decreased at a rate of 0.3° C./h. Upon completion of the crystal growth, the crystal on the seed crystal rod was pulled out, and the temperature was decreased to 30° C. at a rate of 8° C./h, to obtain a nonlinear optical crystal of $CsB_4O_6F$ with a size of 12 mm×15 mm×19 mm.

Example 14: Synthesis of a Nonlinear Optical Crystal of $CsB_4O_6F$ by the High Temperature Solution Method The compound of $CsB_4O_6F$ obtained in accordance with Example 4 was mixed with PbO as a fluxing agent at a molar ratio of 1:0.2, and filled into a platinum crucible. The platinum crucible was placed in a single crystal growing furnace, and the temperature was then increased to 660° C. at a rate of 35° C./h for 8 hours, to give a mixed solution.

Preparation of a seed crystal: the solution as prepared was placed in a single crystal furnace, and the temperature was decreased to 575° C. at a rate of 2° C./h, to 380° C. at a rate of 0.2° C./h, and further to 30° C. at a rate of 7° C./1 h, to give a seed crystal of $CsB_4O_6F$.

Growth of a crystal: the seed crystal of $CsB_4O_6F$ obtained above was fixed on a seed crystal rod. The seed crystal was lowered to 1 mm above the liquid surface from the top of a crystal growing furnace containing the mixed solution as prepared, and preheated for 25 minutes. Then, the seed crystal was contacted with the liquid surface, and the temperature was decreased at a rate of 0.1° C./h. Upon completion of the crystal growth, the crystal on the seed crystal rod was pulled out, and the temperature was decreased to 30° C. at a rate of 7° C./h, to obtain a nonlinear optical crystal of $CsB_4O_6F$ with a size of 10 mm×12 mm×15 mm.

Example 15: Synthesis of a Nonlinear Optical Crystal of $CsB_4O_6F$ by the High Temperature Solution Method The raw materials were weighed at a molar ratio of $CsF:H_3BO_3$=1:4, and mixed with $H_3BO_3$ as a fluxing agent at a molar ratio of 1:0.4. The mixture was filled into a platinum crucible. The platinum crucible was placed in a single crystal growing furnace, and the temperature was then increased to 665° C. at a rate of 37° C./h for 7 hours, to give a mixed solution.

Preparation of a seed crystal: the mixed solution as prepared was placed in a single crystal furnace, and the temperature was decreased to 570° C. at a rate of 2.4° C./h, to 385° C. at a rate of 0.15° C./h, and further to 30° C. at a rate of 7.5° C./h, to give a seed crystal of $CsB_4O_6F$.

Growth of a crystal: the seed crystal of $CsB_4O_6F$ obtained above was fixed on a seed crystal rod. The seed crystal was lowered to 1 mm above the liquid surface from the top of a crystal growing furnace containing the mixed solution as prepared, and preheated for 20 minutes. Then, the seed crystal was contacted with the liquid surface, and the temperature was decreased at a rate of 0.15° C./h. Upon completion of the crystal growth, the crystal on the seed crystal rod was pulled out, and the temperature was further decreased to 30° C. at a rate of 7.5° C./h, to obtain a nonlinear optical crystal of $CsB_4O_6F$ with a size of 13 mm×14 mm×16 mm.

Example 16: Growth of a $CsB_4O_6F$ Crystal by the Vacuum Encapsulation Method

The compound of $CsB_4O_6F$ obtained in accordance with Example 6 was mixed with $B_2O_3$ as a fluxing agent at a molar ratio of 1:0.1, and filled into a Φ40 mm quartz tube. The quartz tube was vacuumized to a vacuum degree of $1\times10^{-3}$ Pa, and vacuum encapsulated with a flame gun. The quartz tube was placed in a muffle furnace, and the temperature was increased to 400° C. at a rate of 10° C./h for 3 hours. Then, the temperature was decreased to 330° C. at a rate of 0.5° C./day, and further to 30° C. at a rate of 2° C./h. The quartz tube was cut apart to obtain a nonlinear optical crystal of $CsB_4O_6F$ with a size of 13 mm×16 mm×21 mm.

Example 17: Growth of a $CsB_4O_6F$ Crystal by the Vacuum Encapsulation Method

The compound of $CsB_4O_6F$ obtained in accordance with Example 7 was mixed with CsF as a fluxing agent at a molar ratio of 1:1, and filled into a Φ40 mm quartz tube. The quartz tube was vacuumized to a vacuum degree of $1\times10^{-3}$ Pa, and vacuum encapsulated with a flame gun. The quartz tube was placed in a muffle furnace, and the temperature was increased to 700° C. at a rate of 50° C./h for 96 hours. Then, the temperature was decreased to 450° C. at a rate of 1.5° C./day, and further to 30° C. at a rate of 5° C./h. The quartz tube was cut apart to obtain a nonlinear optical crystal of $CsB_4O_6F$ with a size of 15 mm×18 mm×23 mm.

Example 18: Growth of a $CsB_4O_6F$ Crystal by the Vacuum Encapsulation Method

The compound of $CsB_4O_6F$ obtained in accordance with Example 8 was mixed with $H_3BO_3$ as a fluxing agent at a molar ratio of 1:0.3, and filled into a Φ40 mm quartz tube. The quartz tube was vacuumized to a vacuum degree of $1\times10^{-3}$ Pa, and vacuum encapsulated with a flame gun. The quartz tube was placed in a muffle furnace, and the temperature was increased to 500° C. at a rate of 35° C./h for 50 hours. Then, the temperature was decreased to 430° C. at a rate of 0.5° C./day, and further to 30° C. at a rate of 4° C./h. The quartz tube was cut apart to obtain a nonlinear optical crystal of $CsB_4O_6F$ with a size of 14 mm×16 mm×17 mm.

Example 19: Growth of a $CsB_4O_6F$ Crystal by the Vacuum Encapsulation Method

The compound of $CsB_4O_6F$ obtained in accordance with Example 9 was mixed with PbO as a fluxing agent at a molar ratio of 1:0.4, and filled into a Φ40 mm quartz tube. The quartz tube was vacuumized to a vacuum degree of $1\times10^{-3}$ Pa, and vacuum encapsulated with a flame gun. The quartz tube was placed in a muffle furnace, and the temperature was increased to 520° C. at a rate of 32° C./h for 52 hours. Then, the temperature was decreased to 435° C. at a rate of 0.8° C./day, and further to 30° C. at a rate of 4.5° C./h. The quartz tube was cut apart to obtain a nonlinear optical crystal of $CsB_4O_6F$ with a size of 14 mm×16 mm×17 mm.

Example 20: Growth of a $CsB_4O_6F$ Crystal by the Vacuum Encapsulation Method

The raw materials were weighed according to CsF:$H_3BO_3$=1:4. The compound of $CsB_4O_6F$ thus obtained was mixed with $PbF_2$ as a fluxing agent at a molar ratio of 1:0.5, and filled into a Φ40 mm quartz tube. The quartz tube was vacuumized to a vacuum degree of $1\times10^{-3}$ Pa, and vacuum encapsulated with a flame gun. The quartz tube was placed in a muffle furnace, and the temperature was increased to 510° C. at a rate of 37° C./h for 96 hours. Then, the temperature was decreased to 445° C. at a rate of 1.2° C./day, and further to 30° C. at a rate of 3.5° C./h. The quartz tube was cut apart to obtain a nonlinear optical crystal of $CsB_4O_6F$ with a size of 14 mm×16 mm×17 mm.

Example 21: Synthesis of a Nonlinear Optical Crystal of $CsB_4O_6F$ by the Czochralski Method The compound of $CsB_{10}O_6F$ obtained in accordance with Example 10 was filled into a clean platinum crucible. The platinum crucible was placed in a muffle furnace, and the temperature was increased to 700° C. at a rate of 40° C./h for 15 hours, to give a melt.

The temperature of the melt obtained above was decreased to 590° C. at a rate of 5° C./h, to 440° C. at a rate of 2° C./h, and further to 30° C. at a rate of 15° C./h, to give a seed crystal of $CsB_4O_6F$.

The seed crystal of $CsB_4O_6F$ obtained above was fixed on a seed crystal rod. The seed crystal was lowered to 1 mm above the liquid surface from the top of a crystal growing furnace containing the melt as prepared, and preheated for 5 minutes. The seed crystal was then immersed in the liquid at 5 mm below the surface, and rotated at 30 rpm by a crystal growth controller. The melt was saturated by controlling the temperature, and the seed crystal was lifted at a rate of 3 mm/day while the temperature was kept constant. Upon completion of the crystal growth, the crystal on the seed crystal rod was pulled out, and the temperature was decreased to 440° C. at a rate of 2° C./h, and further to 30° C. at a rate of 15° C./h, to obtain a nonlinear optical crystal of $CsB_4O_6F$ with a size of 12 mm×15 mm×16 mm.

Example 22: Synthesis of a Nonlinear Optical Crystal of $CsB_4O_6F$ by the Czochralski Method The compound of $CsB_2O_6F$ obtained in accordance with Example 2 was filled into a platinum crucible. The platinum crucible was placed in a single crystal growing furnace, and the temperature was increased to 400° C. at a rate of 20° C./h for 7 hours, to give a melt.

The temperature of the melt obtained above was decreased to 400° C. at a rate of 0.1° C./h, to 300° C. at a rate of 0.2° C./h, and further to 30° C. at a rate of 3° C./h, to give a seed crystal of $CsB_4O_6F$.

The seed crystal of $CsB_4O_6F$ obtained above was fixed on a seed crystal rod. The seed crystal was lowered to 1 mm above the liquid surface from the top of a crystal growing furnace containing the melt as prepared, and preheated for 5 minutes. The seed crystal was then immersed in the liquid at 1 mm below the surface, and rotated at 2 rpm by a crystal growth controller. The melt was saturated by controlling the temperature, and the seed crystal was lifted at a rate of 1 mm/day while the temperature was kept constant. Upon completion of the crystal growth, the crystal on the seed crystal rod was pulled out, and the temperature was decreased to 300° C. at a rate of 0.2° C./h, and further to 30° C. at a rate of 3° C./h, to obtain a nonlinear optical crystal of $CsB_4O_6F$ with a size of 11 mm×14 mm×15 mm.

Example 23: Synthesis of a Nonlinear Optical Crystal of $CsB_4O_6F$ by the Czochralski Method The raw materials were weighed according to CsF:$H_3BO_3$=1:4, and filled into a clean platinum crucible. The platinum crucible was placed in a muffle furnace, and the temperature was increased to 650° C. at a rate of 30° C./h for 12 hours, to give a melt.

The temperature of the melt obtained above was decreased to 580° C. at a rate of 4° C./h, to 440° C. at a rate of 1° C./h, and further to 30° C. at a rate of 6° C./h, to give a seed crystal of $CsB_4O_6F$.

The Seed crystal of $CsB_4O_6F$ obtained above was fixed on a seed crystal rod. The seed crystal was lowered to 1 mm above the liquid surface from the top of a crystal growing furnace containing the melt as prepared, and preheated for 15 minutes. The seed crystal was then immersed in the liquid at 3 mm below the surface, and rotated at 8 rpm by a crystal growth controller. The melt was saturated by controlling the temperature, and the seed crystal was lifted at a rate of 3 mm/day while the temperature was kept constant. Upon completion of the crystal growth, the crystal on the seed crystal rod was pulled out, and the temperature was decreased to 440° C. at a rate of 1° C./h, and further to 30° C. at a rate of 6° C./h, to obtain a nonlinear optical crystal of $CsB_4O_6F$ with a size of 17 minx 19 mm×20 mm.

Example 24: Growth of a $CsB_4O_6F$ Crystal by the Bridgman-Stockbarger Method

The compound of $CsB_4O_6F$ obtained in accordance with Example 4 was filled into a platinum crucible. The platinum crucible was placed in a single crystal growing furnace, and the temperature was increased to 700° C. at a rate of 20° C./h for 15 hours, to give a melt.

The temperature of the melt obtained above was decreased to 590° C. at a rate of 5° C./h, to 440° C. at a rate of 2° C./h, and further to 30° C. at a rate of 15° C./h. The platinum crucible was removed to give a seed crystal of $CsB_4O_6F$.

The seed crystal obtained above was placed at the bottom of the platinum crucible, and then the compound of $CsB_4O_6F$ obtained was also placed in the platinum crucible. The platinum crucible was sealed and placed in a Bridgman-Stockbarger furnace, and the temperature was increased to 700° C. for 15 hours. The position of the platinum crucible was adjusted such that the seeding temperature was 625° C. Then, the platinum crucible was lowered at a rate of 10 mm/day while the growth temperature was kept constant. Upon completion of the growth, the temperature was decreased to 440° C. at a rate of 2° C./h, and further to 30° C. at a rate of 15° C./h. The platinum crucible was removed to obtain a nonlinear optical crystal of $CsB_4O_6F$ with a size of 18 mm×23 mm×24 mm.

Example 25: Growth of a $CsB_4O_6F$ Crystal by the Bridgman-Stockbarger Method

The compound of $CsB_5O_6F$ obtained in accordance with Example 5 was filled into a platinum crucible. The platinum crucible was placed in a single crystal growing furnace, and the temperature was increased to 675° C. at a rate of 40° C./h for 7 hours, to give a melt.

The temperature of the melt obtained above was decreased to 575° C. at a rate of 0.1° C./h, to 380° C. at a rate of 1.5° C./h, and further to 30° C. at a rate of 12° C./h. The platinum crucible was removed to give a seed crystal of $CsB_4O_6F$.

The seed crystal obtained above was placed at the bottom of the platinum crucible, and then the compound of $CsB_4O_6F$ obtained was also placed in the platinum crucible. The platinum crucible was sealed and placed in a Bridgman-Stockbarger furnace, and the temperature was then increased to 500° C. for 7 hours. The position of the platinum crucible was adjusted such that the seeding temperature was 500° C. Then, the platinum crucible was lowered at a rate of 1 mm/day while the growth temperature was kept constant. Upon completion of the growth, the temperature was decreased to 300° C. at a rate of 0.2° C./h, and further to 30° C. at a rate of 3° C./h. The platinum crucible was removed to obtain a nonlinear optical crystal of $CsB_4O_6F$ with a size of 19 mm×22 mm×23 mm.

Example 26: Growth of a $CsB_4O_6F$ Crystal by the Bridgman-Stockbarger Method

The raw materials were weighed according to CsF: $B_2O_3$=1:2, and filled into a platinum crucible. The platinum crucible was placed in a muffle furnace, and the temperature was increased to 680° C. at a rate of 30° C./h for 24 hours, to give a melt.

The temperature of the melt obtained above was decreased to 570° C. at a rate of 3° C./h, to 350° C. at a rate of 1° C./h, and further to 30° C. at a rate of 15° C./h. The platinum crucible was removed to give a seed crystal of $CsB_4O_6F$.

The seed crystal obtained above was placed at the bottom of the platinum crucible, and then the compound of $CsB_4O_6F$ obtained was also placed in the platinum crucible. The platinum crucible was sealed and placed in a Bridgman-Stockbarger furnace, and the temperature was increased to 680° C. for 12 hours. The position of the platinum crucible was adjusted such that the seeding temperature was 550° C. Then, the platinum crucible was lowered at a rate of 5 mm/day while the growth temperature was kept constant. Upon completion of the growth, the temperature was decreased to 350° C. at a rate of 1° C./h, and further to 30° C. at a rate of 15° C./h. The platinum crucible was removed to obtain a nonlinear optical crystal of $CsB_4O_6F$ with a size of 15 mm×16 mm×23 mm.

Example 27: Synthesis of a Nonlinear Optical Crystal of $CsB_4O_6F$ by the Kyropoulos Method The compound of $CsB_2O_6F$ obtained in accordance with Example 2 was filled into a platinum crucible. The platinum crucible was placed in a single crystal growing furnace, and the temperature was increased to 630° C. at a rate of 40° C./h for 18 hours, to give a melt.

The temperature of the melt obtained above was decreased to 565° C. at a rate of 5° C./h, to 380° C. at a rate of 2° C./h, and further to 30° C. at a rate of 8° C./h, to give a seed crystal of $CsB_4O_6F$.

The seed crystal of $CsB_4O_6F$ obtained above was fixed on a seed crystal rod. The seed crystal was lowered to 1 mm above the liquid surface from the top of a crystal growing furnace containing the melt as prepared, and preheated for 60 minutes. The seed crystal was then immersed in the liquid at 5 mm below the surface, and the temperature was decreased at a rate of 0.7° C./h. 3 hours later, the seed crystal was lifted by 2 mm. The temperature was further decreased at a rate of 0.7° C./h. Upon completion of the crystal growth, the crystal on the seed crystal rod was pulled out, and the temperature was decreased to 440° C. at a rate of 2° C./h, and further to 30° C. at a rate of 15° C./h, to obtain a nonlinear optical crystal of $CsB_4O_6F$ with a size of 4 mm×6 mm×9 mm.

Example 28: Synthesis of a Nonlinear Optical Crystal of $CsB_4O_6F$ by the Kyropoulos Method The compound of $CsB_3O_6F$ obtained in accordance with Example 3 was filled into a platinum crucible. The platinum crucible was placed in a single crystal growing furnace, and the temperature was increased to 640° C. at a rate of 20° C./h for 24 hours, to give a melt.

The temperature of the melt obtained above was decreased to 560° C. at a rate of 6° C./h, to 390° C. at a rate of 1.8° C./h, and further to 30° C. at a rate of 3.5° C./h, to give a seed crystal of $CsB_4O_6F$.

The crystal was grown in the melt of the compound by the Kyropoulos method as below. The seed crystal of $CsB_4O_6F$ obtained above was fixed on a seed crystal rod. The seed crystal was lowered to 1 mm above the liquid surface from the top of a crystal growing furnace containing the melt as prepared, and preheated for 5 minutes. The seed crystal was then immersed in the liquid at 1 mm below the surface, and the temperature was decreased at a rate of 0.1° C./h. 10 hours later, the seed crystal was lifted by 1 mm, and the temperature was further decreased at a rate of 0.1° C./h. Upon completion of the crystal growth, the crystal on the seed crystal rod was pulled out, and the temperature was decreased to 300° C. at a rate of 0.2° C./h, and further to 30° C. at a rate of 3° C./h, to obtain a nonlinear optical crystal of $CsB_4O_6F$ with a size of 13 mm×18 mm×24 mm.

Example 29: Synthesis of a Nonlinear Optical Crystal of $CsB_4O_6F$ by the Room Temperature Solution Method The compound of $CsB_4O_6F$ obtained in accordance with Example 1 was put into a clean glass container, to which 100 mL of deionized water was added. Then, ultrasonication was performed for 5 minutes to allow for sufficient mixing and dissolution. Then, the pH of the solution was adjusted to 8 by addition of HF or CsOH.

The container containing the solution was sealed with weighing paper and placed in a static environment without shaking, pollution and air convection. The evaporation rate was controlled at 2 mL/day by piercing the seal, and the solution was set aside for 5 days.

Crystal particles were grown at the bottom of the container from the solution. Upon completion of the growth when the size of the crystal particles was no longer changed significantly, a seed crystal was obtained.

The remaining solution was filtered with qualitative filter paper to filter out grains and other impurities from the solution. The seed crystal of better quality was selected, fixed with a platinum wire and suspended in the filtered solution. The evaporation rate was controlled at 2 mL/day by piercing the seal. The solution was set aside for 30 days at room temperature, to obtain a nonlinear optical crystal of $CsB_4O_6F$ with a size of 8 mm×14 mm×17 mm.

Example 30: Synthesis of a Nonlinear Optical Crystal of $CsB_4O_6F$ by the Room Temperature Solution Method The raw materials were weighed according to CsF:$B_2O_3$=1:2, and put into a clean glass container, to which 20 mL of deionized water was added. Then, ultrasonication was performed for 30 minutes to allow for sufficient mixing and dissolution. Then, the pH of the solution was adjusted to 11 by addition of HF or CsOH.

The container containing the solution was sealed with weighing paper and placed in a static environment without shaking, pollution and air convection. The evaporation rate was controlled at 0.2 mL/day by piercing the seal, and the solution was set aside for 20 days.

Crystal particles were grown at the bottom of the container from the solution. Upon completion of the growth when the size of the crystal particles was no longer changed significantly, a seed crystal was obtained.

The remaining solution was filtered with qualitative filter paper to filter out grains and other impurities from the solution. The seed crystal was fixed with a platinum wire and suspended in the filtered solution. The evaporation rate was controlled at 0.2 mL/day by piercing the seal. The solution was set aside for 30 days at room temperature, to obtain a nonlinear optical crystal of $CsB_4O_6F$ with a size of 4 mm×8 mm×9 mm.

Example 31: Synthesis of a Nonlinear Optical Crystal of $CsB_4O_6F$ by the Hydrothermal Method The compound of $CsB_4O_6F$ obtained in accordance with Example 1 was added to 5 mL of deionized water. The incompletely dissolved mixture was sonicated at a temperature of 20° C. for 5 minutes to allow for sufficient mixing.

The mixed solution was transferred into the lining of a clean, pollution-free high pressure reactor with a volume of 100 mL, and the reactor was tightened and sealed.

The high pressure reactor was placed in a thermostat, and the temperature was increased to 350° C. at a rate of 50° C./h for 3 days. Then, the temperature was decreased to room temperature at a rate of 5° C./day. The high pressure reactor was opened to obtain a nonlinear optical crystal of $CsB_4O_6F$ with a size of 8 mm×9 mm×15 mm.

Example 32: Synthesis of a Nonlinear Optical Crystal of $CsB_4O_6F$ by the Hydrothermal Method The raw materials were weighed according to CsF:$H_3BO_3$=1:4, and added to 30 mL of deionized water. The incompletely dissolved mixture was sonicated at a temperature of 50° C. for 30 minutes to allow for sufficient mixing.

The mixed solution was transferred into the lining of a clean, pollution-free high pressure reactor with a volume of 100 mL, and the reactor was tightened and sealed.

The high pressure reactor was placed in a thermostat, and the temperature was increased to 150° C. at a rate of 5° C./h for 15 days. Then, the temperature was decreased to room temperature at a rate of 30° C./day. The high pressure reactor was opened to obtain a nonlinear optical crystal of $CsB_4O_6F$ with a size of 22 mm×24 mm×27 mm.

Example 33: Synthesis of a Nonlinear Optical Crystal of $CsB_4O_6F$ by the Hydrothermal Method The compound of $CsB_4O_6F$ obtained in accordance with Example 2 was added to 8 mL of deionized water. The incompletely dissolved mixture was sonicated at a temperature of 45° C. for 30 minutes to allow for sufficient mixing.

The mixture was transferred into the lining of a clean, pollution-free high pressure reactor with a volume of 100 mL, and the reactor was tightened and sealed.

The high pressure reactor was placed in a thermostat, and the temperature was increased to 330° C. at a rate of 40° C./h for 10 days. Then, the temperature was decreased to room temperature at a rate of 8° C./day. The high pressure reactor was opened to obtain a nonlinear optical crystal of $CsB_4O_6F$ with a size of 12 mm×18 mm×20 mm.

Example 34

Figure 3:
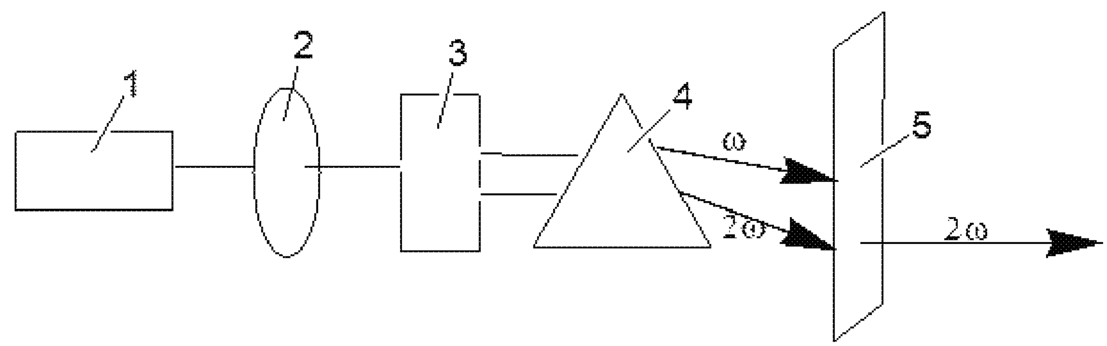
FIG. 3 illustrates the operating principle of the nonlinear optical device made of the $CsB_4O_6F$ crystal of the present invention, wherein 1 represents a laser, 2 represents an emitted beam, 3 represents a $CsB_4O_6F$ crystal, 4 represents an outgoing beam, and 5 represents a filter.

The $CsB_4O_6F$ crystal obtained from any one of Examples 1-33 was processed in the phase-matched direction and was arranged in the position of 3 as shown in FIG. 3. At room temperature, a Q switched Nd:YAG laser was used as the light source with an fundamental wavelength of 1064 nm. The Q switched Nd:YAG laser 1 emitted an infrared beam 2 with a wavelength of 1064 nm onto the $CsB_4O_6F$ single crystal 3, producing a green frequency-multiplied light with a wavelength of 532 nm, with an output intensity that is about 2 times that of KDP under the equivalent condition.

Example 35

The $CsB_4O_6F$ crystal obtained from any one of Examples 1-33 was processed in the phase-matched direction, and was arranged in the position of 3 as shown in FIG. 3. At room temperature, a Q switched Nd:YAG laser was used as the light source with an incident wavelength of 532 nm. The Q switched Nd:YAG laser 1 emitted an infrared beam 2 with a wavelength of 532 nm onto the $CsB_4O_6F$ single crystal 3, producing a frequency-multiplied light with a wavelength of 266 nm, with an output intensity that is about 0.5 times that of BBO under the equivalent condition.

Example 36

The $CsB_4O_6F$ crystal obtained from any one of Examples 1-33 was processed in the phase-matched direction, and was arranged in the position of 3 as shown in FIG. 3. At room temperature, a Q switched Nd:YAG laser was used as the light source with an incident wavelength of 355 nm. The Q switched Nd:YAG laser 1 emitted an infrared beam 2 with a wavelength of 355 nm onto the $CsB_4O_6F$ single crystal 3. An output of a deep-ultraviolet frequency-multiplied light with a wavelength of 177.3 nm could be observed.

What is claimed is:

1. A nonlinear optical crystal of cesium fluorooxoborate, wherein a chemical formula of the nonlinear optical crystal is $CsB_4O_6F$ and a molecular weight of the nonlinear optical crystal is 291.15, and the nonlinear optical crystal belongs to an orthorhombic crystal system, with a space group of $Pna2_1$, crystal cell parameters of a=7.9241 Å, b=11.3996 Å, c=6.6638 Å, and $\alpha=\beta=\gamma=90°$, and a unit cell volume of 601.95 $Å^3$.

2. A method for preparing the nonlinear optical crystal of cesium fluorooxoborate of claim 1, wherein the nonlinear optical crystal is grown by a melt method, a high temperature solution method, a vacuum encapsulation method, a hydrothermal method or a room temperature solution method; wherein the melt method for growing the nonlinear optical crystal of cesium fluorooxoborate comprises following steps:

a) mixing a Cs-containing compound, a B-containing compound and an F-containing compound homogeneously at a molar ratio of (0.5-2):(3-5):(0.5-2) to obtain a first mixture; filling the first mixture into a platinum crucible; then placing the platinum crucible in a muffle furnace, and increasing a first temperature to 350-600° C. for 3-96 hours, to obtain a polycrystal powder of the compound of $CsB_4O_6F$; wherein the Cs-containing compound is $Cs_2CO_3$, $CsNO_3$, $CsNO_3$, $CsHCO_3$, CsF or $CsBF_4$; the F-containing compound is CsF or $CsBF_4$; and the B-containing compound is $H_3BO_3$, $B_2O_3$ or $CsBF_4$;

b) filling the polycrystal powder of the compound of $CsB_4O_6F$ into a clean platinum crucible; placing the clean platinum crucible in a muffle furnace, and increasing a second temperature to 400-700° C. at a rate of 20-40° C./h for 7-15 hours, to obtain a melt; wherein the Cs-containing compound is $Cs_2CO_3$, $CsNO_3$, $CsHCO_3$, CsF or $CsBF_4$; the F-containing compound is CsF or $CsBF_4$; and the B-containing compound is $H_3BO_3$, $B_2O_3$ or $CsBF_4$;

c) decreasing the second temperature of the melt from step b) to 400-590° C. at a rate of 0.1-5° C./h, to 300-440° C. at a rate of 0.2-2° C./h, and further to 30° C. at a rate of 3-15° C./h, to obtain a seed crystal of $CsB_4O_6F$; and d) growing the seed crystal in the melt of the compound by a Czochralski method, comprising fixing the seed crystal obtained from step c) onto a seed crystal rod; lowering the seed crystal to 1 mm above a liquid surface from a top of a crystal growing furnace for the melt prepared in step b), and preheating the seed crystal for 5-60 minutes; then immersing the seed crystal in a liquid at 1-5 mm below the liquid surface; rotating the seed crystal at 2-30 rpm by a crystal growth controller and controlling a third temperature to saturate the melt; lifting the seed crystal at a rate of 1-3 mm/day while keeping the third temperature constant; upon completion of a crystal growth, pulling a crystal on the seed crystal rod, and decreasing the third temperature to 300-440° C. at a rate of 0.2-2° C./h, and further to 30° C. at a rate of 3-15° C./h, to obtain the nonlinear optical crystal of $CsB_4O_6F$;

or growing the seed crystal in the melt of the compound by a Kyropoulos method, comprising fixing the seed crystal obtained from step c) onto a seed crystal rod; lowering the seed crystal to 1 mm above a liquid surface from a top of a crystal growing furnace for the melt prepared in step b), and preheating the seed crystal for 5-60 minutes; then immersing the seed crystal in a liquid at 1-5 mm below the liquid surface; decreasing a third temperature at a rate of 0.1-0.7° C./h; 3-10 hours later, lifting the seed crystal by 1-2 mm, and further decreasing the third temperature at a rate of 0.1-0.7° C./h; upon completion of a crystal growth, pulling a crystal on the seed crystal rod, and decreasing the third temperature to 300-440° C. at a rate of 0.2-2° C./h, and further to 30° C. at a rate of 3-15° C./h, to obtain the nonlinear optical crystal of $CsB_4O_6F$;

or growing the crystal in the melt of the compound by a Bridgeman-Stockbarger method, comprising placing the seed crystal prepared in step c) at a bottom of a platinum crucible, then adding the polycrystal powder of the compound of $CsB_4O_6F$ prepared in step a) to the platinum crucible; sealing the platinum crucible, and increasing a third temperature of the growing furnace to 500-700° C. for 7-15 hours; adjusting a position of the platinum crucible to allow a seeding temperature to be 500-625° C.; then lowering the platinum crucible at a rate of 1-10 mm/day; upon completion of the growing, decreasing the seeding temperature to 300-440° C. at a rate of 0.2-2° C./h, and further to 30° C. at a rate of 3-15° C./h; and removing the platinum crucible, to obtain the nonlinear optical crystal of $CsB_4O_6F$;

the high temperature solution method for growing the nonlinear optical crystal of cesium fluorooxoborate comprises following steps:

a) mixing a Cs-containing compound, a B-containing compound and an F-containing compound homogeneously at a molar ratio of 0.5-2:3-5:0.5-2 to obtain a second mixture; filling the second mixture into a platinum crucible; then placing the platinum crucible in a muffle furnace, and increasing a fourth temperature to 350-600° C. for 3-96 hours, to obtain a polycrystal powder of the compound of $CsB_4O_6F$; wherein the Cs-containing compound is $Cs_2CO_3$, $CsNO_3$, $CsHCO_3$, CsF or $CsBF_4$; the F-containing compound is CsF or $CsBF_4$; and the B-containing compound is $H_3BO_3$, $B_2O_3$ or $CsBF_4$;

b) mixing the polycrystal powder of the compound of $CsB_4O_6F$ obtained from step a) homogeneously with a fluxing agent at a molar ratio of 1:(0.1-0.5) to obtain a third mixture; then filling the third mixture into a clean platinum crucible, and increasing a fifth temperature to 400-700° C. at a rate of 35-45° C./h for 7-15 hours, to obtain a first mixed solution; wherein the Cs-containing compound is $Cs_2CO_3$, $CsNO_3$, $CsHCO_3$, CsF or $CsBF_4$; the F-containing compound is CsF or $CsBF_4$; the B-containing compound is $H_3BO_3$, $B_2O_3$ or $CsBF_4$; and the fluxing agent is CsF, $H_3BO_3$, $B_2O_3$, PbO or $PbF_2$;

c) preparation of a seed crystal: placing the first mixed solution prepared in step b) into a single crystal furnace, and then decreasing a sixth temperature to 350-610° C. at a rate of 0.1-5° C./h, to 300-385° C. at a rate of 0.2-0.6° C./h, and further to 30° C. at a rate of 3-10° C./h, to obtain a seed crystal of $CsB_4O_6F$; and d) growth of a crystal: fixing the seed crystal of $CsB_4O_6F$ onto a seed crystal rod; lowering the seed crystal to 1 mm above a liquid surface from a top of a crystal growing furnace for the first mixed solution prepared in step b), and preheating the seed crystal for 10-25 minutes; contacting the seed crystal with the liquid surface, and decreasing a seventh temperature at a rate of 0.1-2° C./h; upon completion of a crystal growth, pulling a crystal away from the surface of the first mixed solution, and then decreasing the seventh temperature to 30° C. at a rate of 3-10° C./h, to obtain the nonlinear optical crystal of $CsB_4O_6F$;

the vacuum encapsulation method for growing the nonlinear optical crystal of cesium fluorooxoborate comprises following steps:

a) mixing a Cs-containing compound, a B-containing compound and an F-containing compound homogeneously at a molar ratio of (0.5-2):(3-5):(0.5-2) to a fourth mixture; filling the fourth mixture into a platinum crucible; then placing the platinum crucible in a muffle furnace, and increasing an eighth temperature to 350-600° C. at a rate of 10-50° C. for 3-96 hours, to obtain a polycrystal powder of the compound of $CsB_4O_6F$; wherein the Cs-containing compound is $Cs_2CO_3$, $CsNO_3$, $CsHCO_3$, CsF or $CsBF_4$; the F-containing compound is CsF or $CsBF_4$; and the B-containing compound is $H_3BO_3$, $B_2O_3$ or $CsBF_4$; and b) mixing the polycrystal powder of the compound of $CsB_4O_6F$ obtained from step a) homogeneously with a fluxing agent at a molar ratio of 1:(0.1-1) to obtain a fifth mixture; then filling the fifth mixture into a quartz tube, and increasing a ninth temperature to 400-700° C. at a rate of 10-50° C./h for 3-96 hours; then decreasing the ninth temperature to 330-450° C. at rate of 0.5-1.5° C./day, and further to 30° C. at a rate of 2-5° C./h; and cutting the quartz tube to obtain the nonlinear optical crystal of $CsB_4O_6F$; wherein the Cs-containing compound is $Cs_2CO_3$, $CsNO_3$, $CsHCO_3$, CsF or $CsBF_4$; the F-containing compound is CsF, $CsBF_4$ or HF; the B-containing compound is $H_3BO_3$, $B_2O_3$ or $CsBF_4$; and the fluxing agent is CsF, $H_3BO_3$, $B_2O_3$, PbO or $PbF_2$;

the hydrothermal method for growing the nonlinear optical crystal of cesium fluorooxoborate comprises following steps:

a) mixing a Cs-containing compound, a B-containing compound and an F-containing compound homogeneously at a molar ratio of (0.5-2):(3-5):(0.5-2) to obtain a sixth mixture; filling the sixth mixture into a platinum crucible; then placing the platinum crucible in a muffle furnace, and increasing a tenth temperature to 350-600° C. for 3-96 hours, to obtain a polycrystal powder product of $CsB_4O_6F$; wherein the Cs-containing compound is $Cs_2CO_3$, $CsNO_3$, $CsHCO_3$, CsF or $CH_3COOCs$; the F-containing compound is CsF or HF; and the B-containing compound is $H_3BO_3$ or $B_2O_3$;

b) dissolving the polycrystal powder of the compound of $CsB_4O_6F$ obtained from step a) in 5-30 mL of deionized water to obtain a incompletely dissolved mixture, and sonicating the incompletely dissolved mixture at an eleventh temperature of 20-50° C. for 5-30 minutes to allow for sufficient mixing and dissolution to obtain a second mixed solution;

c) transferring the second mixed solution obtained from step b) into a lining of a clean, pollution-free high pressure reactor with a volume of 100 mL, and tightening and sealing the clean, pollution-free high pressure reactor; and d) placing the clean, pollution-free high pressure reactor in a thermostat, increasing a twelfth temperature to 150-350° C. at a rate of 5-50° C./h for 3-15 days, and then decreasing the twelfth temperature to room temperature at a rate of 5-30° C./day, to obtain the nonlinear optical crystal of $CsB_4O_6F$;

and the room temperature solution method for growing the nonlinear optical crystal of cesium fluorooxoborate comprises following steps:

a) mixing a Cs-containing compound, a B-containing compound and an F-containing compound homogeneously at a molar ratio of (0.5-2):(3-5):(0.5-2) to obtain a seventh mixture; filling the seventh mixture into a platinum crucible; then placing the platinum crucible in a muffle furnace, and increasing a thirteenth temperature to 350-600° C. for 3-96 hours, to obtain a polycrystal powder product of $CsB_4O_6F$; wherein the Cs-containing compound is $Cs_2CO_3$, $CsNO_3$, $CsHCO_3$, CsF or $CH_3COOCs$; the F-containing compound is CsF or HF; and the B-containing compound is $H_3BO_3$ or $B_2O_3$;

b) placing the polycrystal powder of the compound of $CsB_4O_6F$ obtained from step a) in a clean glass container, 20-100 mL of deionized water is added to the clean glass container to obtain a solution, followed by ultrasonication for 5-60 minutes to allow for sufficient mixing and dissolution, and then adjusting a pH of the solution to 8-11 by addition of HF or CsOH;

c) sealing the clean glass container containing the solution in step b) with weighing paper to have a seal, and placing the clean glass container in a static environment without shaking, pollution and air convection; controlling a evaporation rate at 0.2-2 mL/day by piercing the seal; and setting the clean glass container aside for 5-20 days at room temperature;

d) obtaining a seed crystal upon completion of a growth when a size of crystal particles grown at a bottom of the clean glass container from the solution in step c) is no longer changed significantly; and e) filtering a remaining solution through qualitative filter paper to filter out grains and other impurities from the remaining solution to obtain a filtered solution; selecting seed crystal of better quality, fixing the seed crystal with a platinum wire and suspending the seed crystal in the filtered solution; controlling the evaporation rate at 0.2-2 mL/day by piercing the seal, and setting the seed crystal aside for growth for 5-20 days at room temperature, to obtain the nonlinear optical crystal of $CsB_4O_6F$.

3. A method to apply the nonlinear optical crystal of cesium fluorooxoborate of claim 1 in a manufacture of an Nd:YAG laser, comprising the following steps:

step 1) using the Nd:YAG laser as light source with a fundamental frequency light of 1064 nm;

step 2) making the Nd:YAG laser emit an infrared beam with a wavelength of 1064 nm onto the nonlinear optical crystal of cesium fluorooxoboratea to produce a green frequency-multiplied light with a second, third, fourth, fifth or sixth harmonic generation laser output.

4. A method to apply the nonlinear optical crystal of cesium fluorooxoborate of claim 1 in a production of a deep-ultraviolet frequency-multiplied light below 200 nm, comprising the following steps:

step 1) using the Nd:YAG laser as light source with an incident wavelength of 532 nm;

step 2) making the Nd:YAG laser emit an infrared beam with a wavelength of 532 nm onto the nonlinear optical crystal of cesium fluorooxoboratea to produce a frequency-multiplied light with a wavelength of 266 nm with an output intensity, wherein the output intensity is about 0.5 times that of $BaB_2O_4$ under an equivalent condition.

5. A method to apply the nonlinear optical crystal of the compound of cesium fluorooxoborate of claim 1 in a manufacture of a frequency multiplication generator, a frequency up or down converter or an optical parametric oscillator, comprising the following steps:

step 1) using the Nd:YAG laser as light source with an incident wavelength of 355 nm;

step 2) making the Nd:YAG laser emit an infrared beam with a wavelength of 355 nm onto the nonlinear optical crystal of cesium fluorooxoboratea to output a deep-ultraviolet frequency-multiplied light with a wavelength of 177.3 nm.

* * * * *